(12) United States Patent
Wang et al.

(10) Patent No.: US 12,165,877 B2
(45) Date of Patent: Dec. 10, 2024

(54) METHODS FOR ETCHING A MATERIAL LAYER FOR SEMICONDUCTOR APPLICATIONS

(71) Applicant: Applied Materials, Inc., Santa Clara, CA (US)

(72) Inventors: Zhigang Wang, Xi'an (CN); Jiao Yang, Xi'an (CN); Heng Wang, Shaanxi (CN); Alfredo Granados, San Antonio, TX (US); Jon C. Farr, Tempe, AZ (US); Ruizhe Ren, Shaanxi (CN)

(73) Assignee: Applied Materials, Inc., Santa Clara, CA (US)

( * ) Notice: Subject to any disclaimer, the term of this patent is extended or adjusted under 35 U.S.C. 154(b) by 246 days.

(21) Appl. No.: 17/770,019

(22) PCT Filed: Dec. 23, 2019

(86) PCT No.: PCT/CN2019/127495
§ 371 (c)(1),
(2) Date: Apr. 18, 2022

(87) PCT Pub. No.: WO2021/127862
PCT Pub. Date: Jul. 1, 2021

(65) Prior Publication Data
US 2022/0399205 A1    Dec. 15, 2022

(51) Int. Cl.
*H01L 21/311* (2006.01)
*H01L 21/02* (2006.01)
(Continued)

(52) U.S. Cl.
CPC .... *H01L 21/31116* (2013.01); *H01L 21/0212* (2013.01); *H01L 21/02167* (2013.01);
(Continued)

(58) Field of Classification Search
None
See application file for complete search history.

(56) References Cited

U.S. PATENT DOCUMENTS

2003/0211753 A1* 11/2003 Nallan ............ H01L 21/30655
438/719
2004/0092118 A1* 5/2004 Johnson ........... H01L 21/67017
438/696
(Continued)

FOREIGN PATENT DOCUMENTS

CN      103534196 A       1/2014
CN      104658962 A  *    5/2015
(Continued)

OTHER PUBLICATIONS

Taiwan Office Action issued to Application No. 109144471 on Apr. 13, 2022.
(Continued)

*Primary Examiner* — Shamim Ahmed
(74) *Attorney, Agent, or Firm* — Patterson + Sheridan, LLP

(57) ABSTRACT

An apparatus and method for etching a material layer with a cyclic etching and deposition process. The method for etching a material layer on a substrate includes: (a) etching at least a portion of a material layer (302) on a substrate (101) in an etch chamber (100) to form an open feature (360) having a bottom surface (312) and sidewalls in the material layer (302); (b) forming a protection layer (314) on the sidewalls and the bottom surface (312) of the open feature (360) from a protection layer (314) gas mixture comprising at least one carbon-fluorine containing gas; (c) selectively removing the protection layer (314) formed on the bottom surface (312) of the open feature (360) from a bottom surface (312) open gas mixture comprising the carbon-fluorine containing gas; and (d) continuingly etching the
(Continued)

material layer (302) from the bottom surface (312) of the open feature (360) until a desired depth of the open feature (360) is reached.

18 Claims, 3 Drawing Sheets

(51) Int. Cl.
   *H01L 21/3213* (2006.01)
   *H01J 37/32* (2006.01)
(52) U.S. Cl.
   CPC .... *H01L 21/0228* (2013.01); *H01L 21/31144* (2013.01); *H01L 21/32137* (2013.01); *H01L 21/32139* (2013.01); *H01J 37/32165* (2013.01); *H01J 37/32174* (2013.01); *H01J 2237/3341* (2013.01)

(56) References Cited

U.S. PATENT DOCUMENTS

2012/0152895 A1* 6/2012 Chebi ................ B81C 1/00619
216/37
2013/0237062 A1* 9/2013 Winniczek .......... B81C 1/00619
438/719
2017/0338124 A1* 11/2017 Launay ............. H01L 21/67069
2019/0362984 A1* 11/2019 Katsunuma ....... H01L 21/02238

FOREIGN PATENT DOCUMENTS

| | | |
|---|---|---|
| CN | 105329846 A | 2/2016 |
| CN | 105390433 A | 3/2016 |
| CN | 110021550 A | 7/2019 |
| KR | 10-2005-0118267 A | 12/2005 |

OTHER PUBLICATIONS

International Search Report and Written Opinion dated Sep. 24, 2020 for Application No. PCT/CN2019/127495.
Korean Office Action issued to Application No. 10-2022-7025469 on Apr. 24, 2024.

* cited by examiner

METHODS FOR ETCHING A MATERIAL LAYER FOR SEMICONDUCTOR APPLICATIONS

BACKGROUND

Field

Embodiments of the present disclosure generally relate to methods for etching a material layer, and more particularly to methods of etching a material layer in a substrate using a cyclic etching and deposition process in the semiconductor applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thus creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. However, designs of the three dimensional (3D) stacking of semiconductor chips often further pushes the geometry limits of the structures against technology limits, the need for accurate process control for the manufacture of small critical dimensional structures with high aspect ratio has become increasingly important. Poor process control during etching process will result in irregular structure profiles and line edge roughness, thus resulting poor line integrity of the formed structures. Additionally, irregular profiles and growth of the etching by-products formed during etching may gradually block the small openings used to fabricate the small critical dimension structures, thereby resulting in bowed, distorted, toppled, or twisted profiles of the etched structures.

Thus, there is a need for improved methods and apparatus that may etch a material layer with high aspect ratio with accurate process and profile control.

SUMMARY

Embodiments of the present disclosure provide an apparatus and methods for etching a material layer with a cyclic etching and deposition process. a method for etching a material layer on a substrate includes (a) etching at least a portion of a material layer on a substrate in an etch chamber to form an open feature having a bottom surface and sidewalls in the material layer, (b) forming a protection layer on the sidewalls and the bottom surface of the open feature from a protection layer gas mixture comprising at least one carbon-fluorine containing gas, (c) selectively removing the protection layer formed on the bottom surface of the open feature from a bottom surface open gas mixture comprising the carbon-fluorine containing gas, and (d) continuingly etching the material layer from the bottom surface of the open feature until a desired depth of the open feature is reached.

In another embodiment, a method for etching a material layer on a substrate includes a method for etching a material layer on a substrate includes (a) supplying a preliminary etching gas mixture to etch a portion of a material layer on a substrate disposed in a processing chamber to form an open feature in the material layer, (b) supplying a protection layer deposition gas mixture to form a protection layer on the sidewalls and the bottom surface of the open feature, wherein the protection layer deposition gas mixture comprises a carbon-fluorine containing gas, (c) supplying a bottom surface open gas mixture to selectively remove the protection layer formed on the bottom surface of the open feature, wherein the bottom surface open gas mixture comprises the carbon-fluorine containing gas and a halogen containing gas, and (d) supplying a main etching gas mixture to continue etching the material layer from the bottom surface of the open feature until a desired depth of the open feature is reached, wherein the main gas mixture comprises the carbon-fluorine containing gas and the halogen containing gas.

In yet another embodiment, a method for etching a material layer on a substrate includes (a) applying a first RF bias power to etching at least a portion of a material layer on the substrate in the etch chamber to form an open feature having a bottom surface and sidewalls in the material layer, (b) applying a second RF bias power in a first gas mixture comprising carbon-fluorine containing gas to form a protection layer on the sidewalls and the bottom surface of the open feature, wherein the second RF bias power is greater than the first RF bias power, (c) applying a third RF bias power in a second gas mixture comprising the carbon-fluorine containing gas to selectively remove the protection layer formed on the bottom surface of the open feature, wherein the third RF bias power is greater than the second RF bias power, and (d) continuingly etching the material layer from the bottom surface of the open feature until a desired depth of the open feature is reached.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for etching a material layer for high aspect ratio features formed on or in a substrate for semiconductor devices. In one embodiment, the etching process may use a cyclic etching and deposition process to etch the substrate while forming a protection layer as needed. Multiple cycles of the etching and deposition processes may be utilized to control etching profile and feature transfer to a substrate or a material layer disposed on a substrate.

Figure 1:
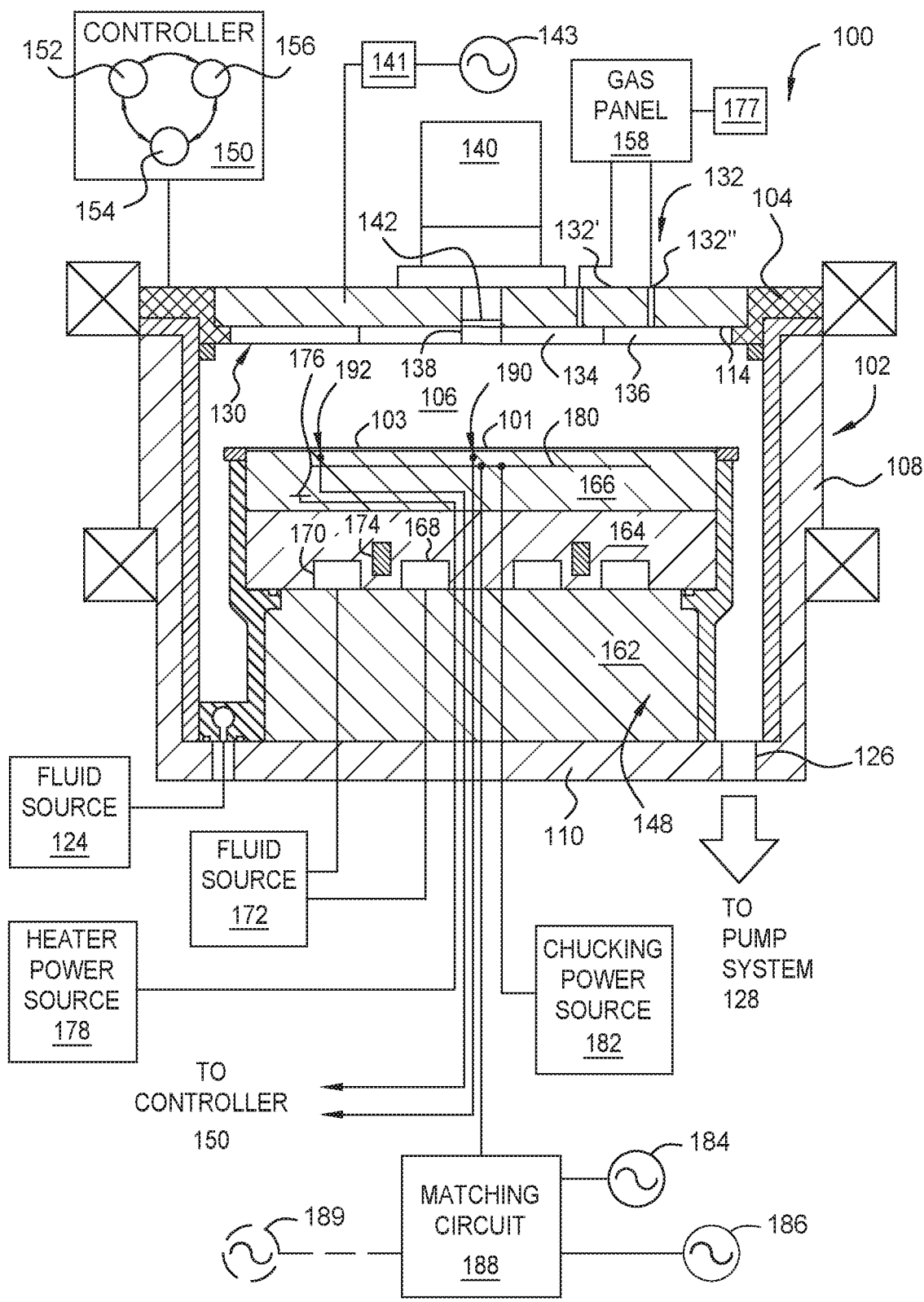
FIG. 1 depicts an apparatus utilized to performing an etching process in accordance with one embodiment of the disclosure.

FIG. 1 is a sectional view of one embodiment of a processing chamber 100 suitable for performing an etching process to etch a material layer on a substrate using cyclic etching and deposition processes. Suitable processing chambers that may be adapted for use with the teachings disclosed herein include, for example, a modified ENABLER® processing chamber available from Applied Materials, Inc. of Santa Clara, California Although the processing chamber 100 is shown including a plurality of features that enable superior etching and deposition performance, it is contemplated that other processing chambers may be adapted to benefit from one or more of the features disclosed herein.

The processing chamber 100 includes a chamber body 102 and a lid 104 which enclose an interior volume 106. The chamber body 102 is fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 101 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 101 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, California.

A gas panel 158 is coupled to the processing chamber 100 to provide process and/or cleaning gases to the interior volume 106. In the embodiment depicted in FIG. 1, inlet ports 132', 132" are provided in the lid 104 to allow gases to be delivered from the gas panel 158 to the interior volume 106 of the processing chamber 100. In one embodiment, the gas panel 158 is adapted to provide fluorinated process gas through the inlet ports 132', 132" and into the interior volume 106 of the processing chamber 100. In one embodiment, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 101 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 101 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138.

The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the embodiment FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 101 during processing. The substrate support pedestal assembly 148 generally includes a plurality of lift pins (not shown) disposed therethrough that are configured to lift the substrate 101 from the substrate support pedestal assembly 148 and facilitate exchange of the substrate 101 with a robot (not shown) in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 101 below showerhead assembly 130. The electrostatic chuck 166 is driven by a chucking power source 182 to develop an electrostatic force that holds the substrate 101 to the chuck surface, as is conventionally known. Alternatively, the substrate 101 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 101 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 101.

In one embodiment, the substrate support pedestal assembly 148 is configured as a cathode and includes an electrode 180 that is coupled to a plurality of RF power bias sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the embodiment depicted in FIG. 1, the dual RF bias power sources 184, 186 are coupled to the electrode 180 disposed in the substrate support pedestal assembly 148 through a matching circuit 188. The signal generated by the RF bias power 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

In one mode of operation, the substrate 101 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing system 100 are handled through numerous signal cables.

Figure 2:
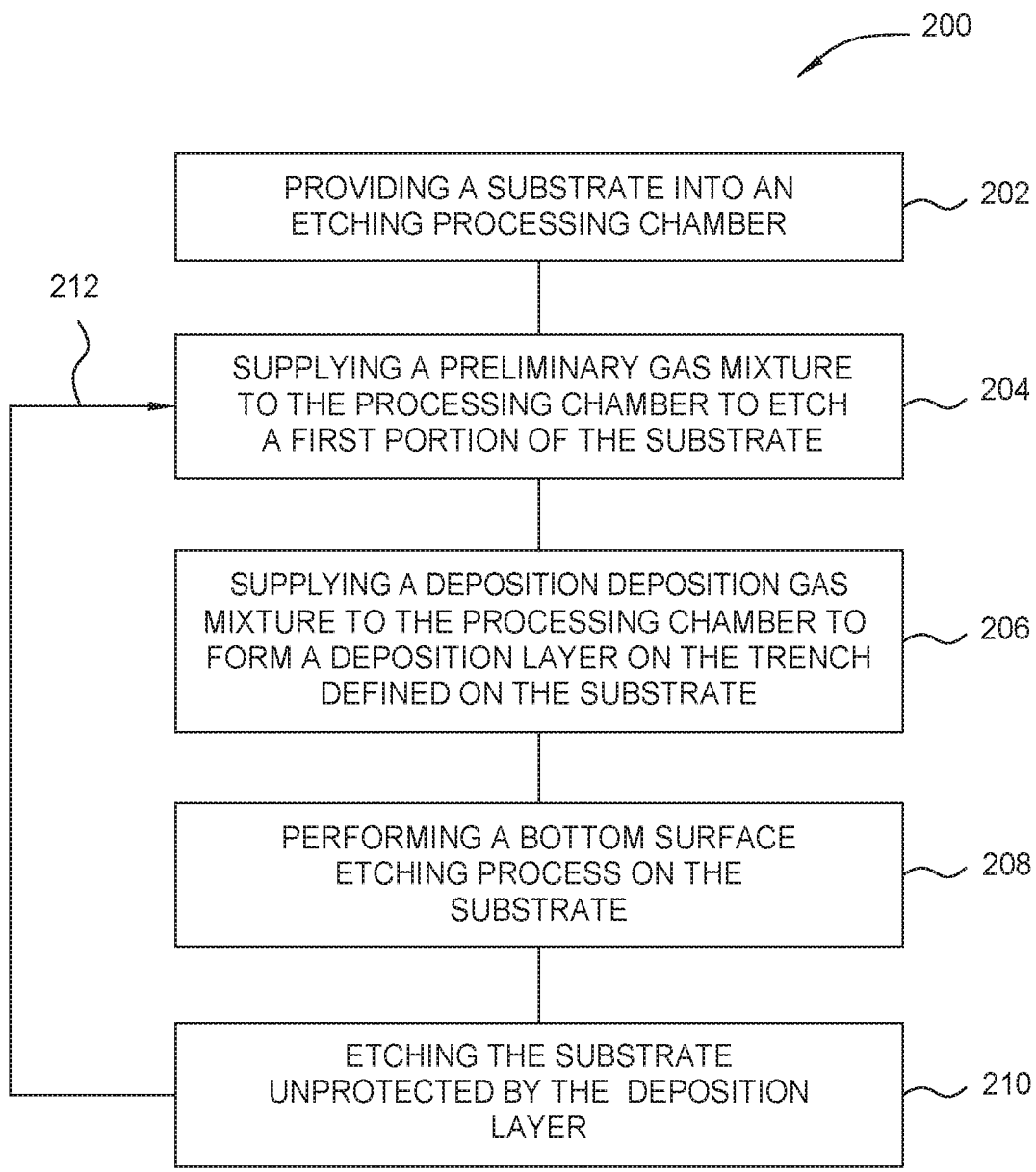
FIG. 2 depicts a flow diagram of a method for performing an etching process using a cyclic etching process in accordance with one embodiment of the disclosure.

FIG. 2 is a flow diagram of one embodiment of an etch process 200 that may be practiced in the chamber 100 or other suitable processing chamber. FIGS. 3A-3F are schematic cross-sectional views of a portion of a composite substrate 101 corresponding to various stages of the process 200. The process 200 may be utilized to form high aspect ratio features, e.g., greater than 10:1, such as greater than 20:1, for structures, for semiconductor devices. Alternatively, the process 200 may be beneficially utilized to etch other types of structures as needed.

The process 200 begins at operation 202 by transferring (i.e., providing) a substrate, such as the substrate 101, to an etch process chamber, such as the etch chamber 100 depicted in FIG. 1. The substrate 101 may have a substantially planar surface, an uneven surface, or a substantially planar surface having a structure formed thereon. In the embodiment depicted in FIG. 3A, the substrate 101 has a patterned mask layer 304 disposed on a material layer 302. In one embodiment, the material layer 302 may be utilized to form a gate structure, a shallow trench isolation (STI) structure, a contact structure or an interconnection structure in the front end or back end processes. In one embodiment, the method 200 may be performed on the material layer 302 to form features and/or trenches therein. In some embodiment, the material layer 302 may be part of the substrate 101 so that the etching process as performed forms the trenches/features into the substrate 101 as needed. The substrate 101 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 102 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate.

Figure 3A:
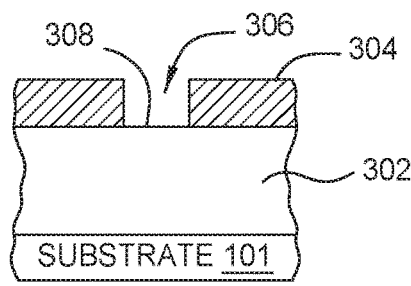
FIG. 3A-3F depict one embodiment of a sequence for etching a material layer formed on the method of FIG. 2 in accordance with one embodiment of the disclosure.
Figure 3B:
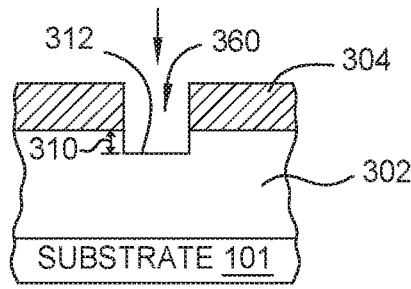

In one embodiment, the material layer 302 is a silicon containing material layer. The patterned mask layer 304 has an open feature 306 that exposes portions 308 of the material layer 302 for etching. In one embodiment, the mask layer 304 may be a hard mask, a photoresist mask or a combination thereof. The open feature 306 in the mask layer 304 is used as an etch mask to form open features 360 (as shown in FIG. 3B) in the material layer 302 with desired aspect ratios. The open features 360 described herein may include trenches, vias, openings and the like. In one embodiment, the mask layer 304 may be a material selected from a group consisting of silicon, silicon oxide, silicon nitride, silicon oxynitride, silicon carbide, amorphous carbon, and combinations thereof. In an exemplary embodiment depicted herein, the mask layer 304 is a silicon oxide layer. In some embodiments, the mask layer 304 may be a patterned photoresist layer, such as a lithographically patterned mask or fabricated by other materials. The photoresist layer may is a positive tone photoresist, a negative tone photoresist, a UV lithography photoresist, an i-line photoresist, an e-beam resist (for example, a chemically amplified resist (CAR)) or other suitable photoresist. In yet another embodiment, the mask layer 304 may be a combination of a photoresist layer disposed on a hardmask layer.

The material layer 302 may be a silicon containing material. The material layer 302 may include multiple layers, composite layers, or a single layer. Suitable materials for the silicon containing material include undoped crystalline silicon, amorphous silicon, polycrystalline silicon, microcrystalline silicon, doped crystalline silicon material, and combinations thereof. The material layer 302 may also be a composite layer including silicon oxide/silicon nitride and polysilicon. In an exemplary embodiment depicted herein, the material layer 302 is a silicon material. In some embodiment, the material layer 302 may be part of the substrate 101 as needed.

At operation 204, a preliminary etching gas mixture is supplied to etch the material layer 302 to a predetermined depth 310 to expose a portion 312 of the material layer 302, as shown in FIG. 3B. The material layer 302 may be etched by supplying the preliminary etching gas mixture into the processing chamber along with a RF source and with or without bias power applied to the processing chamber. As the material layer 302 is etched without much of etching byproduct accumulation at this stage (e.g., etching byproducts often accumulate with the increase of the etching time), the preliminary etching gas mixture supplied at operation 204 etches the material layer 302 to a relatively deeper depth, as compared to other etching operations at the method 200.

In one example, the preliminary etching gas mixture includes any gas suitable for etching a silicon containing material. In one embodiment, the preliminary etching gas mixture may include, but not limited to, a halogen containing gas and a carbon-fluorine containing gas.

Suitable examples for the halogen containing gas includes HBr, chlorine gas ($Cl_2$), nitrogen trifluoride ($NF_3$), sulfur hexafluoride gas ($SF_6$) and the like. Suitable examples for the carbon-fluorine containing gas includes carbon tetrafluoride ($CF_4$), $C_2F_4$, $C_4F_8$, $C_4F_6$, $CHF_3$, $CH_2F_2$, $CH_3F$ and the like.

In one example, the preliminary etching gas mixture includes a halogen containing gas and a carbon-fluorine containing gas and optionally an inert gas. In one example, the preliminary etching gas mixture includes a hexafluoride gas ($SF_6$) gas and $C_4F_8$ gas.

Several process parameters are regulated while the preliminary etching gas mixture supplied into the etch chamber. In one embodiment, the chamber pressure in the presence of the preliminary etching gas mixture is regulated. In one exemplary embodiment, a process pressure in the etch chamber is regulated between about 2 mTorr to about 200 mTorr, for example, between about 40 mTorr and about 100 mTorr. RF source and/or bias power may be applied to maintain a plasma formed from the first etching gas mixture. In one example, the bias power may not be supplied during the preliminary etching process so as to main the etching process isotropic as needed. For example, a RF source power of between about 100 Watts to about 1500 Watts may be applied to an inductively coupled antenna source to maintain a plasma inside the etch chamber. A RF bias power, when used, of about less than 100 Watts are applied while supplying the preliminary etching gas mixture. The preliminary etching gas mixture may be flowed into the chamber at a rate between about 50 sccm to about 1000 sccm. A substrate temperature is maintained between about −20 degrees Celsius to about 80 degrees Celsius.

Figure 3C:
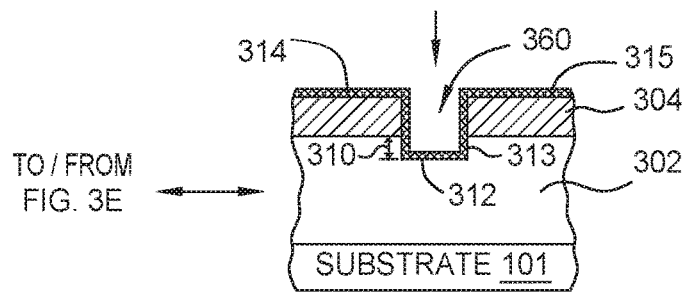

In one example, the preliminary etching gas mixture is continuously supplied until the predetermined depth 310 is reached, forming the open features 360 (e.g., an opening, a trench, a via, or an aperture) with an aspect ratio greater than 10:1, such as between about 15:1 and about 20:1. In one example, the predetermined depth 310 is about 15000 nm and about 25000 nm. The predetermined depth 310 may be between about 30% and about 60%, such as between about 40% and about 50%, of the total depth 324 (as shown in FIG. 3F) to be etched away from the material layer 302.

At operation 206, after the predetermined depth 310 is reached, a protection layer deposition gas mixture is then supplied. The preliminary etching gas mixture is then terminated and switched to the protection layer deposition gas mixture. The protection layer deposition gas mixture assists depositing a protection layer 314 on the material layer 302, covering the sidewalls 313 and the bottom surface 312 of the open feature 360 as well as a top surface 315 of the mask layer 304, as shown in FIG. 3C. The protection layer deposition gas mixture includes at least a carbon-fluorine containing gas. The fluorine elements from the carbon-fluorine containing gas reacts with the silicon elements from the substrate while supplying the carbon elements to react with the dangling silicon elements, forming a silicon carbon material as the protection layer 314 at the exposed surfaces of the material layer 302 across the substrate 101. The carbon elements from the carbon-fluorine containing gas may also form a polymer structure to be adhered or reacted with the portions of the exposed material layer 302 exposed by the open feature 360, e.g., a polysilicon layer, to form the protection layer 314. Thus, the protection layer 314 may be a carbon polymer material, a silicon carbon containing materials, or a combination thereof. The protection layer 314 serves as a passivation layer to protect the underlying material layer 302 from being attacked while removing the remaining portion of the material layer 302 from the substrate 101.

Suitable examples of the carbon-fluorine containing gas include carbon tetrafluoride ($CF_4$), $C_2F_4$, $C_4F_8$, $C_4F_6$, $CHF_3$, $CH_2F_2$, $CH_3F$ and the like. In one particular example, the protection layer deposition gas mixture includes $C_4F_8$. Inert gas, such as He and Ar, may also be optionally supplied in the protection layer deposition gas mixture as needed. The carbon-fluorine containing gas may be flowed at a rate between about 50 sccm to about 2000 sccm.

Several process parameters are regulated while the protection layer deposition gas mixture is supplied into the etch chamber. In one embodiment, the chamber pressure in the presence of the protection layer deposition gas mixture inside the etch chamber is regulated. In one exemplary embodiment, a pressure of the oxygen-containing gas in the etch chamber is regulated between about 2 mTorr to about 150 mTorr, for example, between about 40 mTorr to about 100 mTorr. A RF source power may be applied to maintain a plasma. For example, a RF source power of about 200 Watts to about 1500 Watts may be applied to an inductively coupled antenna source to maintain a plasma inside the etch chamber. A RF bias power is supplied at greater than 100 Watts, such as greater than 10 Watts, such as between about 5 Watts and about 50 Watts. The RF bias power as supplied to form the protection layer 314 at operation 206 is similar to or greater than the RF bias power as supplied to etch the material layer 302 at operation 204. In one example, the RF bias power when supplying the protection layer deposition gas mixture is between about 10% and about 300% greater than the RF bias power supplied while etching the material layer 302 at operation 204.

The protection layer 314 as formed may be utilized as a protective/passivation layer during the subsequent etching process so as to protect certain locations of the film layers, such as the sidewalls 313 of the open features 360, thus improving and enhancing the interface protection during the etching process, thus allowing the active etching species from the following operations to travel down to the bottom surface 312 of the open feature 360 for further etching without undesired attack on the sidewalls 313 of the material layer 302.

Figure 3D:
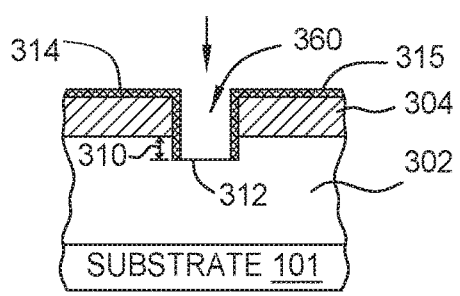

At operation 208, a bottom surface breakthrough process is performed to remove the protection layer 314 on the bottom surface 312 of the open feature 360, as shown in FIG. 3D. The bottom surface breakthrough process provides reactive species that can reach down to the bottom surface of the protection layer 314 until the protection layer 314 on the bottom surface 312 of the open feature 360 is substantially removed. While performing the bottom surface breakthrough process at operation 208, the protection layer 314 located on the sidewalls 313 of the open feature 360 is substantially maintained intact. Thus, the protection layer 314 maintained on the sidewalls 313 may assist protecting the sidewall integrity of the open feature 360 while increasing the aspect ratio of the open feature 360 formed in the material layer 302 during the subsequent etching process.

It is noted that this bottom surface breakthrough process may also be interpreted as a bottom surface opening process performed to etch the bottom surface of the protection layer 314, exposing the fresh underlying material layer 302 ready to be etched so as to keep forming the open feature 360 until a desired depth is reached with the desired aspect ratio.

In one embodiment, the bottom surface breakthrough process is performed by supplying a bottom surface etching gas mixture including one or more of a halogen containing gas and a carbon-fluorine containing gas. The halogen containing gas and the carbon-fluorine containing gas may gently remove the protection layer 314 from the bottom surface 312. In one embodiment, suitable examples of the carbon-fluorine containing gas include carbon tetrafluoride ($CF_4$), $C_2F_4$, $C_4F_8$, $C_4F_6$, $CHF_3$, $CH_2F_2$ and $CH_3F$. Suitable examples of the halogen containing gas include HBr, chlorine gas ($Cl_2$), nitrogen trifluoride ($NF_3$), sulfur hexafluoride gas ($SF_6$) and the like. In one example, an inert gas, such as He, Ar, and the like, may also be supplied in the bottom surface etching gas mixture. In one particular example, the bottom surface etching gas mixture includes a $C_4F_8$ gas, $SF_6$ and, optionally, an Ar gas.

Several process parameters may also be controlled while supplying the bottom surface etching gas mixture to remove the protection layer 314 from the bottom surface 312. The pressure of the processing chamber may be controlled at between about 20 milliTorr and about 200 milliTorr, such as between about 40 milliTorr and about 100 milliTorr. A substrate temperature is maintained between about −20 degrees Celsius to about 100 degrees Celsius. A RF source power may be applied to maintain a plasma. For example, a RF source power of about 200 Watts to about 1500 Watts may be applied to an inductively coupled antenna source to maintain a plasma inside the etch chamber. A RF bias power is supplied at greater than 100 Watts. The RF bias power as supplied to perform the bottom surface breakthrough process at operation 208 is greater than the RF bias power as supplied to form the protection layer 314 at operation 206 and etch the material layer 302 at operation 204. In one example, the RF bias power when supplying the bottom surface breakthrough process is between about 5% and about 100% greater than the RF bias power supplied while protection layer deposition process at operation 206 and etching the material layer 302 at operation 204.

It is believed that the greater power level as applied for the RF bias power may increase the directionality of the reactive species from the bottom surface etching gas mixture and assist pulling and accelerating the reactive species toward the bottom surface 312. Thus, the reactive species can reach to the bottom to remove the protection layer 314 from the bottom surface 312 without substantially attacking and damaging the protection layer 314 formed on the sidewalls 313.

Figure 3E:
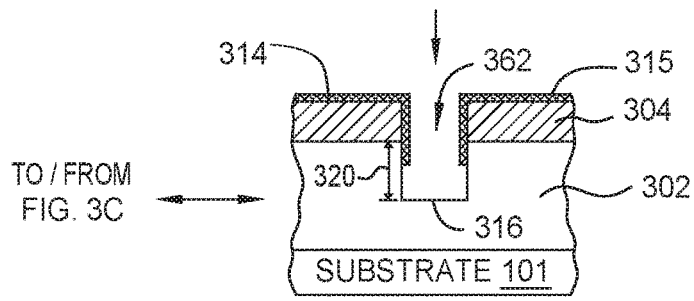
Figure 3F:
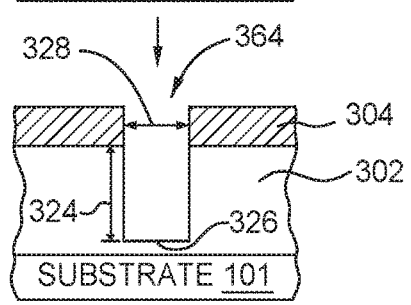

At operation 210, a main etching process is performed by supplying a main etching gas mixture to continue etching the material layer 302 to a second depth 320, as shown in FIG. 3E. The main etching gas mixture may be similar to or the same as the preliminary etching gas mixture at operation 204 to continue etching the material layer 302 while with the sidewall protection from the protection layer 314. In one example, the main etching gas mixture may be continuously supplied until the protection layer 314 is consumed and needed to be replenished. In another example, the main etching gas mixture may be any suitable gas used for etching a silicon layer.

In one embodiment, the main etching gas mixture may include, but not limited to, a halogen containing gas and a carbon-fluorine containing gas. Suitable examples for the halogen containing gas includes HBr, chlorine gas ($Cl_2$), nitrogen trifluoride ($NF_3$), sulfur hexafluoride gas ($SF_6$) and the like. Suitable examples for the carbon-fluorine containing gas includes carbon tetrafluoride ($CF_4$), $C_2F_4$, $C_4F_8$, $C_4F_6$, $CHF_3$, $CH_2F_2$, $CH_3F$ and the like.

In one example, the main etching gas mixture includes a halogen containing gas and a carbon-fluorine containing gas and optionally an inert gas. In one example, the preliminary etching gas mixture includes a hexafluoride gas ($SF_6$) gas and $C_4F_8$ gas.

Similarly, the process parameters regulated while supplying the main etching gas mixture may be similar to or the same as the process parameters regulated while supplying the preliminary etching gas mixture at operation 204. In one embodiment, a process pressure in the etch chamber is regulated between about 2 mTorr to about 100 mTorr. RF source power may be applied to maintain a plasma formed from the main etching gas mixture to etch the material layer 302 on the substrate 101. For example, a RF source power of about 150 Watts to about 1500 Watts may be applied to an inductively coupled antenna source to maintain a plasma inside the etch chamber. A RF bias power may or may not be applied while supplying the main etching gas mixture for etching the material layer 302. In one example, a RF bias power is not applied during the main etching process. In another example, a RF bias power less than 100 Watts may be maintained while supplying the main etching gas mixture to gently etch the material layer 102. The main etching gas mixture may be flowed at a rate between about 50 sccm to about 1000 sccm. A substrate temperature is maintained within a temperature range of about −20 degrees Celsius to about 100 degrees Celsius.

The main etching gas mixture may be continuously supplied until a predetermined process time period is reached or until the protection layer 314 is consumed and needed to be replenished. Thus, the process may be looped back to operation 206 so that the operation 206 to operation 210 may be repeatedly performed until a desired total/final depth 324 is reached, as shown in FIG. 3F.

The operation 206 to 210 may be repeatedly (i.e., cyclically) performed, as indicated by the loop 212 in FIG. 2, until a desired target depth 324 of the feature 364 is formed in the material layer 302, as shown in FIG. 3F. Each cycle of the operation 206 to operation 210 may etch away a depth of between 7000 nm and about 10000 nm of the material layer 302. In one embodiment, the desired target depth 324 may be between about 30000 nm and about 45000 nm with an aspect ratio greater than 20:1, such as between about 30:1 and about 45:1. The repeated processes may cyclically and incrementally etch the material layer 302 without over aggressively attacking the material layer 302 while with proper sidewall protection from the protection layer 314. Incremental etching with repetitive deposition and removal of the material layer 302 improves feature verticality and enhances accuracy of mask to feature CD transfer between the mask 304 and the material layer 302. In one embodiment, the open feature 364 may have a width 364 less than 1000 nm. In one embodiment, the operation 204 to 210 may be repeatedly performed for any times as needed, such as between about 3 times and about 10 times as needed.

Thus, methods for forming features with high aspect ratio and small dimension are provided by a cyclic deposition and etching process. The cyclic deposition and etching process provides sufficient sidewall deposition/protection during the etching process. By doing so, an improved etching process to obtain features with high aspect ratio and small dimension is obtained.

While the foregoing is directed to embodiments of the present disclosure, other and further embodiments of the disclosure may be devised without departing from the basic scope thereof, and the scope thereof is determined by the claims that follow.

What is claimed is:

1. A method for etching a material layer on a substrate comprising:
   (a) etching at least a portion of the material layer on the substrate in an etch chamber to form an open feature having a bottom surface and sidewalls in the material layer;
   (b) forming a protection layer on the sidewalls and the bottom surface of the open feature using a first gas mixture comprising at least one carbon-fluorine containing gas;
   (c) selectively removing the protection layer formed on the bottom surface of the open feature using a first RF bias power and a second gas mixture comprising the carbon-fluorine containing gas; and
   (d) continuingly etching the material layer from the bottom surface of the open feature with a second RF bias power until a desired depth of the open feature is reached, the second RF bias power less than the first RF bias power.

2. The method of claim 1, wherein removing the protection layer further comprises:
   etching the protection layer from the bottom surface of the open feature by a halogen containing gas and the carbon-fluorine containing gas without substantially removing the protection layer on the sidewalls of the open feature.

3. The method of claim 1, further comprising:
   repeating steps (b)-(d) to incrementally etch the material layer.

4. The method of claim 1, wherein removing the protection layer further comprises;
   exposing the bottom surface of the open feature.

5. The method of claim 1, wherein the carbon-fluorine containing gas includes at least one of carbon tetrafluoride ($CF_4$), $C_2F_4$, $C_4F_8$, $C_4F_6$, $CHF_3$, $CH_2F_2$, and $CH_3F$.

6. The method of claim 1, wherein the carbon-fluorine containing gas is $C_4F_8$.

7. The method of claim 1, wherein forming the protection layer further comprises:
   supplying the first gas mixture including the carbon-fluorine containing gas to the substrate.

8. The method of claim 1, wherein the second gas mixture further comprises a halogen containing gas.

9. The method of claim 8, wherein the halogen containing gas is $SF_6$.

10. The method of claim 1, wherein continuingly etching the material layer further comprises:
    supplying a third gas mixture comprising the carbon-fluorine containing gas and a halogen containing gas.

11. The method of claim 10, wherein the carbon-fluorine containing gas includes at least one of carbon tetrafluoride ($CF_4$), $C_2F_4$, $C_4F_8$, $C_4F_6$, $CHF_3$, $CH_2F_2$, and $CH_3F$.

12. The method of claim 10, wherein the carbon-fluorine containing gas is $C_4F_8$ and the halogen containing gas is $SF_6$.

13. The method of claim 1, wherein the material layer is a silicon containing layer.

14. The method of claim 1, wherein a third RF bias power applied when forming the protection layer is less than the first RF bias power applied when selectively removing the protection layer.

15. A method for etching a material layer on a substrate comprising:

(a) supplying a first gas mixture to etch a portion of the material layer on the substrate disposed in a processing chamber to form an open feature in the material layer;

(b) supplying a second gas mixture to form a protection layer on sidewalls and a bottom surface of the open feature, wherein the second gas mixture comprises a carbon-fluorine containing gas;

(c) supplying a third gas mixture and a first RF bias power to selectively remove the protection layer formed on the bottom surface of the open feature, wherein the third gas mixture comprises the carbon-fluorine containing gas and a halogen containing gas; and (d) supplying a fourth gas mixture and a second RF bias power to continue etching the material layer from the bottom surface of the open feature until a desired depth of the open feature is reached, the second RF bias power less than the first RF bias power, wherein the fourth gas mixture comprises the carbon-fluorine containing gas and the halogen containing gas.

16. The method of claim 15, further comprising:
repeating steps (b)-(d) to incrementally etch the material layer.

17. The method of claim 15, wherein the carbon-fluorine containing gas is $C_4F_8$ and the halogen containing gas is $SF_6$.

18. A method for etching a material layer on a substrate comprising:

(a) applying a first RF bias power to etch at least a portion of the material layer on the substrate in an etch chamber to form an open feature having a bottom surface and sidewalls in the material layer;

(b) applying a second RF bias power in a first gas mixture comprising a carbon-fluorine containing gas to form a protection layer on the sidewalls and the bottom surface of the open feature, wherein the second RF bias power is greater than the first RF bias power;

(c) applying a third RF bias power in a second gas mixture comprising the carbon-fluorine containing gas to selectively remove the protection layer formed on the bottom surface of the open feature, wherein the third RF bias power is greater than the second RF bias power; and (d) continuingly etching the material layer from the bottom surface of the open feature with a fourth RF bias power, the fourth RF bias power less than the third RF bias power, until a desired depth of the open feature is reached.

* * * * *